(12) United States Patent
Lee et al.

(10) Patent No.: US 11,349,059 B2
(45) Date of Patent: May 31, 2022

(54) JOSEPHSON JUNCTION DEVICE AND METHOD OF MANUFACTURING THE SAME

(71) Applicant: Samsung Electronics Co., Ltd., Suwon-si (KR)

(72) Inventors: Jaehyeong Lee, Seoul (KR); Hyeokshin Kwon, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/015,512

(22) Filed: Sep. 9, 2020

(65) Prior Publication Data

US 2021/0217946 A1 Jul. 15, 2021

(30) Foreign Application Priority Data

Jan. 14, 2020 (KR) .......................... 10-2020-0004947

(51) Int. Cl.
*H01L 39/02* (2006.01)
*H01L 39/12* (2006.01)
*H01L 39/24* (2006.01)
*H01L 39/22* (2006.01)

(52) U.S. Cl.
CPC ............ *H01L 39/025* (2013.01); *H01L 39/12* (2013.01); *H01L 39/223* (2013.01); *H01L 39/2493* (2013.01)

(58) Field of Classification Search
CPC .. H01L 39/025; H01L 39/223; H01L 39/2493
See application file for complete search history.

(56) References Cited

U.S. PATENT DOCUMENTS

2013/0057333 A1 3/2013 Wu
2016/0372622 A1 12/2016 Fong et al.
2017/0133577 A1 5/2017 Cybart et al.

FOREIGN PATENT DOCUMENTS

KR 10-2015-0087913 A 7/2015
WO WO 2018/160187 A1 9/2018

OTHER PUBLICATIONS

Cao et al. Unconventional superconductivity in magic-angle graphene superlattices, Nature 556 43-50 2018. (Year: 2018).*
Kim, Minsoo, et al., "Strong Proximity Josephson Coupling in Vertically Stacked NbSe2-Graphene-NbSe2 van der Waals Junctions", *Nano Letters*, 17, Oct. 2017 (pp. 6125-6130).
Park, Jinho, et al., "Short Ballistic Josephson Coupling in Planar Graphene Junctions with Inhomogeneous Carrier Doping", *Physical Review Letters*, 120, Jul. 2018 (pp. 1-6).

(Continued)

*Primary Examiner* — Matthew L Reames
(74) *Attorney, Agent, or Firm* — NSIP Law

(57) ABSTRACT

A Josephson junction device includes a planar arrangement including a first two-dimensional (2D) material layer, a graphene layer, and a second 2D material layer planarly arranged on a device substrate, the first 2D material layer including at least one layer of a 2D material, the graphene layer forming a first junction with the first 2D material layer, and the second 2D material layer forming a second junction with the graphene layer and including at least one layer of a 2D material. A distance between the first junction and the second junction is within a range configured to cause a Josephson effect.

20 Claims, 9 Drawing Sheets

(56) References Cited

OTHER PUBLICATIONS

Wang, Joell-Jan et al., "Coherent control of a hybrid superconducting circuit made with graphene-based van der Waals heterostructures", *Nature nanotechnology*, 14, Feb. 2019 (pp. 120-125).

Lee, Jongyun, et al., "Planar graphene Josephson coupling via van der Waals superconducting contacts", *Current Applied Physics*, 19, Mar. 2019 (pp. 251-255).

* cited by examiner

JOSEPHSON JUNCTION DEVICE AND METHOD OF MANUFACTURING THE SAME

CROSS-REFERENCE TO RELATED APPLICATIONS

This application claims the benefit under 35 USC 119(a) of Korean Patent Application No. 10-2020-0004947, filed on Jan. 14, 2020, in the Korean Intellectual Property Office, the entire disclosure of which is incorporated herein by reference for all purposes.

BACKGROUND

1. Field

A Josephson junction device and a method of manufacturing the same are provided.

2. Description of the Background

A quantum bit, i.e., a qubit, is used as a basic unit of information for quantum computers. At least two different quantities may be represented using qubits. A qubit may also refer to an actual physical device in which information is stored or an information unit extracted from a physical device for qubit.

Generally, information storage devices may encode information based on two different states which are classified as "0" and "1". In this case, a quantity encoding a bit state is subject to the laws of classical physics.

Qubits may also include two different physical states classified as "0" and "1". In this case, a quantity encoding a bit state is subject to the laws of quantum physics. When a physical quantity storing such states mechanically operates as a quantum, a quantum information storage device may be additionally located in superposition of "0" and "1". Unlike a normal bit, a qubit has an amplitude and a phase like a wave and entanglement between qubits may occur. Thus, an operation structure for a qubit may be different from that for a normal bit. In particular, qubits are applicable to data science, quantum cryptography, and the like, as well as quantum chemistry based on a quantum mechanical background.

Examples of a quantum system used in such quantum computers include an optics-based quantum system, a superconductivity-based quantum system, an ion trap-based quantum system, a topological materials-based quantum system, and the like. A Josephson junction device is used as a qubit in a superconductivity-based quantum system among the examples of a quantum system.

In principle, an LC resonator may be manufactured by combining a superconducting capacitor with an inductor. Such a superconducting LC resonator has a problem in that quantum information may be stored therein but cannot be controlled. In contrast, a Josephson junction device may be also used as a basic unit of a superconductivity-based quantum computing process because it has characteristics of a variable inductor and thus is capable of storing and controlling quantum information.

In a Josephson junction device, a metal, a semiconductor, an insulator, and the like may be placed between a superconductor and a superconducting electrode. Thus, such a Josephson junction device may be physically or chemically damaged or deformed during lithography, metal thin-film deposition, and the like performed during a manufacturing process.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a Josephson junction device includes a planar arrangement including a first two-dimensional (2D) material layer, a graphene layer, and a second 2D material layer planarly arranged on a device substrate, the first 2D material layer including at least one layer of a 2D material, the graphene layer forming a first junction with the first 2D material layer, and the second 2D material layer forming a second junction with the graphene layer and including at least one layer of a 2D material, wherein a distance between the first junction and the second junction is within a range configured to cause a Josephson effect.

The first 2D material layer and the second 2D material layer may each include a material which generates a superconducting proximity effect at the first and second junctions, respectively, to form superconducting electrodes.

At least one of the first and second 2D material layers may include at least one layer of $NbSe_2$, FeSe, $PdTe_2$, CuFeTe, FeTe, $NbS_2$ (2H-phase), $TaSe_2$ (2H-phase), $TaS_2$ (2H-phase), $Bi_2Sr_2CaCu_2O_{8+\delta}$ (Bi2212), and twisted bilayer graphene to exhibit a superconducting property.

At least one of the first and second 2D material layers may include twisted bilayer graphene to exhibit a superconducting property. The Josephson junction device may further include a gate metal layer, for gate tuning, on at least one of the first and second 2D material layers.

The graphene layer may include single-layer graphene.

A distance between the first junction and the second junction may be about 100 nm to about 500 nm.

The Josephson junction device may further include a protective layer on at least one of upper and lower surfaces of the planar structure including the first 2D material layer, the graphene layer, and the second 2D material layer.

The protective layer may include hexagonal-boron nitride (h-BN).

In another general aspect, a method of manufacturing a Josephson junction device includes forming a planar arrangement of a first two-dimensional (2D) material layer, a graphene layer, and a second 2D material layer in a state attached to an attachment surface of a stamp, the first 2D material layer including at least one layer of a 2D material, the graphene layer forming a first junction with the first 2D material layer, and the second 2D material layer forming a second junction with the graphene layer and including at least one layer of a 2D material, wherein a distance between the first and second junctions is within a range configured to cause a Josephson effect, attaching the planar structure including the first 2D material layer, the graphene layer, and the second 2D material layer to a device substrate by stamping the stamp onto the device substrate, and forming the Josephson junction device including the first 2D material layer, the graphene layer, and the second 2D material layer, which are planarly arranged on the device substrate, by removing a peripheral portion of the planar structure by an etching process.

The forming of the planar structure in the state attached to the attachment surface of the stamp may include preparing a first substrate, a second substrate, and a third substrate on which the first 2D material layer, the graphene layer, and the second 2D material layer are respectively formed, stamping the first 2D material layer to the stamp from the first substrate to attach the first 2D material layer to the attachment surface of the stamp, stamping the graphene layer to the stamp from the second substrate so as to form a first junction with the first 2D material layer such that the first 2D material layer and the graphene layer are planarly attached to the stamp, and stamping the second 2D material layer to the stamp from the third substrate so as to form a second junction with the graphene layer such that the planar structure including the first 2D material layer, the graphene layer, and the second 2D material layer is attached to the stamp.

The method may further include at least one of attaching a first protective layer to the attachment surface of the stamp before the forming of the planar structure to be attached to the attachment surface of the stamp, and forming a second protective layer on the device substrate before the attaching of the planar structure to the device substrate by stamping the stamp to the device substrate, whereby a protective layer may further be provided on at least one of upper and lower surfaces of the planar structure.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
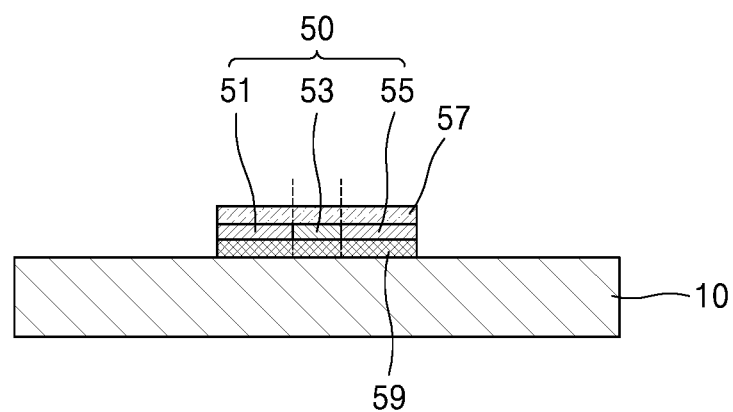
FIG. 1 schematically illustrates a Josephson junction device according to one or more examples of an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items. Expressions such as "at least one of," when preceding a list of elements, modify the entire list of elements and do not modify the individual elements of the list.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may be also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

Provided are a Josephson junction device for forming a Josephson junction free of physical and chemical defects and a manufacturing method thereof.

In a Josephson junction device according to an embodiment, attention is paid to graphene as a connection medium of the Josephson junction device rather than an existing insulator.

When a phenomenon that superconduction occurs in the connection medium of the Josephson junction device is called the Josephson effect, a form of superconduction may reflect characteristics of the connection medium. Therefore, a Josephson junction device having characteristics of graphene is available due to the following characteristics. Graphene shows a completely ballistic property of electron transport (carrier) and n-p polarity and thus may be an alternative to a next silicon semiconductor. In particular, a carrier density of graphene is controllable by a gate voltage and thus may be more easily adjusted than characteristics of other Josephson junctions. In order to maintain properties of graphene, damage or deformation due to physical or chemical bonding should be prevented when a superconductor and graphene are bonded to each other.

FIG. 1 schematically illustrates a Josephson junction device according to one or more examples of an embodiment.

Referring to FIG. 1, the Josephson junction device according to an embodiment includes a planar structure 50 in which a first two-dimensional (2D) material layer 55 that is planarly arranged on a device substrate 10 includes a 2D material in at least one layer, a graphene layer 53 forming a first junction with the first 2D material layer 55, and a second 2D material layer 51 that forms a second junction with the graphene layer 53 and includes a 2D material in at least one layer are arranged in a planar form. In the planar structure 50, the distance between the first junction and the second junction may be within a range that produces the Josephson effect.

A stamp (see FIG. 10A), which may be detachably adhered through a van der Waals effect, may be used to planarly arrange the first 2D material layer 55, the graphene layer 53, and the second 2D material layer 51 of the planar structure 50 on the device substrate 10. To this end, a 2D material which is a van der Waals material may apply to the first 2D material layer 55 and the second 2D material layer 51, in addition to the graphene layer 53 including graphene corresponding to a van der Waals material.

The graphene layer 53 may include single-layer graphene, and the first 2D material layer 55 and the second 2D material layer 51 may include a material generating a superconducting proximity effect at the first junction and the second junction to form a superconducting electrode.

In this case, at least one of the first and second 2D material layers 55 and 51 may include at least one layer of $NbSe_2$, FeSe, $PdTe_2$, CuFeTe, FeTe, $NbS_2$ (2H-phase), $TaSe_2$ (2H-phase), $TaS_2$ (2H-phase), and $Bi_2Sr_2CaCu_2O_{8+\delta}$ (Bi2212) as a 2D material exhibiting a superconducting property or may include twisted bilayer graphene to exhibit a superconducting property. At least one layer of $NbSe_2$ or the like or the twisted bilayer graphene may correspond to a 2D van der Waals superconducting material.

For example, each of the first and second 2D material layers 55 and 51 may include at least one layer of $NbSe_2$. In addition, each of the first and second 2D material layers 55 and 51 may include twisted bilayer graphene. As another example, one of the first and second 2D material layers 55 and 51 may include at least one layer of $NbSe_2$, and the other may include twisted bilayer graphene to exhibit a superconducting property.

For example, when bilayer graphene is formed to have a twisted angle of about 1.14 degrees, the bilayer graphene exhibits a superconducting property and thus it may be applied to at least one of the first and second 2D material layers 55 and 51 to form a superconducting electrode.

In a Josephson junction device according to an embodiment, the first 2D material layer 55 exhibiting a superconducting property and the graphene layer 53 form a first junction and thus graphene is subject to the superconducting proximity effect. In addition, the second 2D material layer 51 exhibiting a superconducting property and the graphene layer 53 form a second junction and thus graphene is subject to the superconducting proximity effect.

When the distance between the first junction and the second junction is close enough to superimpose the superconducting proximity effect on the graphene, the Josephson effect may occur and thus a non-superconducting material may behave like a superconductor.

Therefore, a Josephson junction device in which the first and second 2D material layers 55 and 51 corresponding to the superconducting electrodes and the graphene layer 53 bonded therebetween are planarly arranged may be implemented when the planar structure 50 of the first 2D material layer 55, the graphene layer 53, and the second 2D material layer 51 is formed such that the distance between the first and second junctions at which the first 2D material layer 55 and the second 2D material layer 51 that are formed as superconducting electrodes and the graphene layer 53 are bonded is within a range causing the Josephson effect.

To achieve such a Josephson junction, the distance between the first and second junctions may be, for example, in a range of about 100 to 500 nm.

The Josephson junction device according to an embodiment may further include protective layers 57 and 59 on at least one of upper and lower surfaces of the planar arrangement of the first 2D material layer 55, the graphene layer 53 and the second 2D material layer 51. The protective layers 57 and 59 may include hexagonal boron-nitride (h-BN) which is an insulator. In this case, the h-BN may be crystallized.

FIG. 1 illustrates an example of a case in which the protective layers 57 and 59 are provided on both the upper and lower surfaces of the planar arrangement of the first 2D material layer 55, the graphene layer 53, and the second 2D material layer 51 but the protective layers 57 and 59 may be provided on only one of the upper or lower surfaces of the planar arrangement. As another example, the protective layers 57 and 59 may not be provided on any one of the upper and lower surfaces of the planar arrangement.

As described above, the graphene layer 53 may be covered with, for example, the protective layers 57 and 59 which include h-BN and thus characteristics of 2D graphene may be corrected relative to $SiO_2$, Si or the like having an amorphous surface, thereby further achieving ballistic characteristics and protecting the Josephson junction device from being chemically and physically damaged.

In the Josephson junction device according to an embodiment, the planar arrangement of the first 2D material layer 55, the graphene layer 53 and the second 2D material layer 51 may be achieved by applying, for example, single-layer graphene to the graphene layer 53, and the Josephson effect may be controlled by changing electrical characteristics through a gate because material properties of graphene may be gate-tuned, thereby changing a threshold current value. Accordingly, the Josephson junction device is available as a qubit device.

Figure 2:
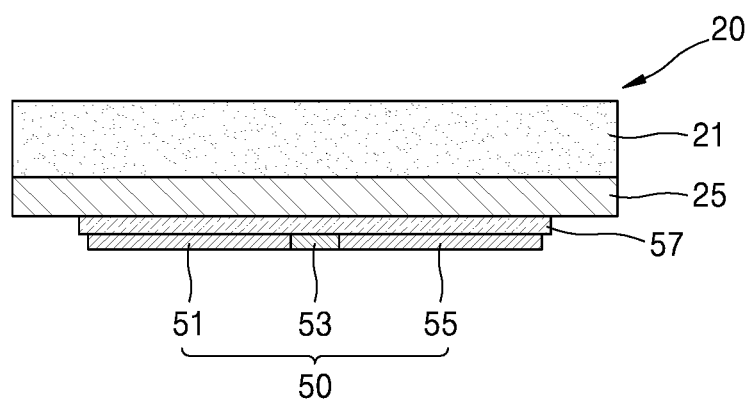
FIGS. 2 to 4 illustrate a process of manufacturing a Josephson junction device according to one or more examples of an embodiment.
Figure 3:
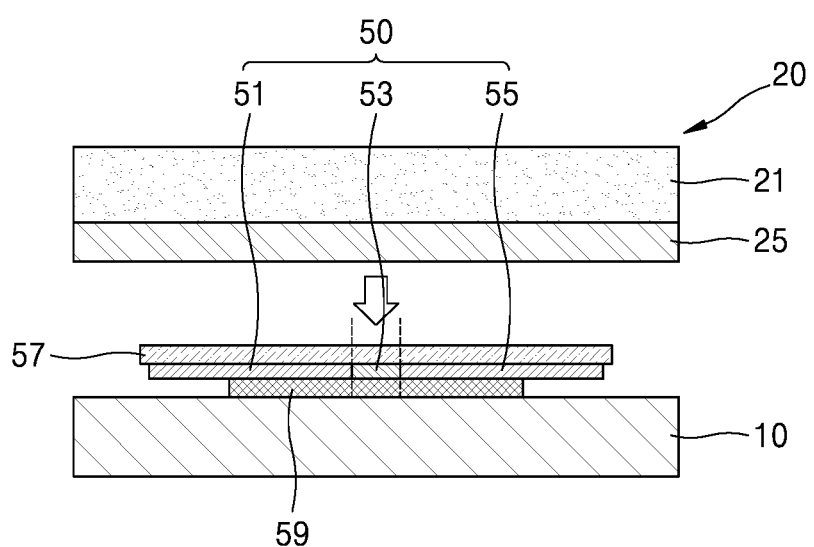
Figure 4:
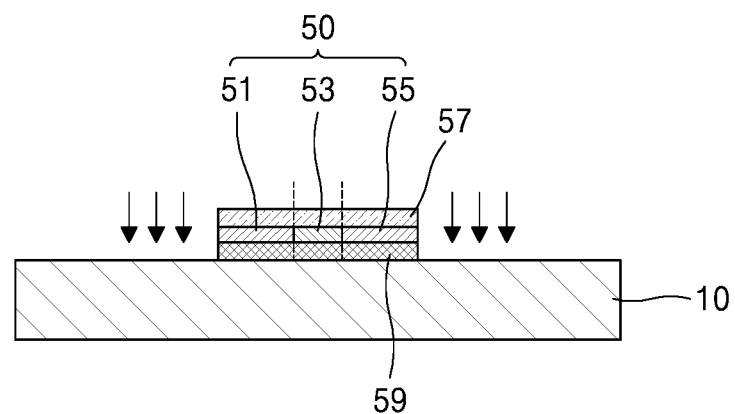

A manufacturing process of a Josephson junction device according to one or more examples of an embodiment will be described with reference to FIGS. 2 to 4, 10A to 10F, and 11A to 11D below. FIGS. 2 to 4 illustrate a process of manufacturing a Josephson junction device according to one or more examples of an embodiment. FIGS. 10A to 10F illustrate a preparation process for manufacturing a Josephson junction device according to one or more examples of an embodiment. FIGS. 11A to 11D illustrate a process of forming a planar structure 50, which includes a first 2D material layer 55, a graphene layer 53, and a second 2D material layer 51, in a state attached onto an attachment surface of a stamp 20. Here, components that are the same as or similar to those of FIG. 1 are denoted by the same reference numerals while redundant descriptions thereof may be omitted.

In order to manufacture the Josephson junction device according to an embodiment, the planar structure 50 of the first 2D material layer 55, the graphene layer 53 forming a first junction with the first 2D material layer 55, and the second 2D material layer 51 forming a second junction with the graphene layer 53, is formed in a state attached to an attachment surface of a stamp 20 as illustrated in FIG. 2.

Figure 10A:
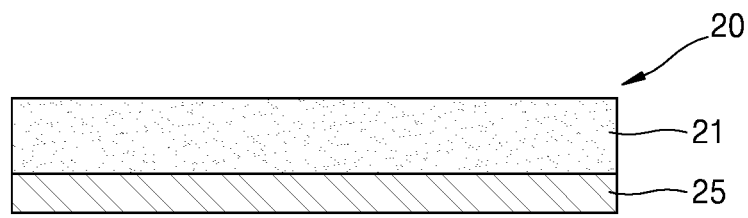
FIGS. 10A to 10F illustrate a preparation process for manufacturing a junction device according to one or more examples of an embodiment.

As illustrated in FIG. 10A, the stamp 20 may be provided by stamping a material, such as an organic silicone mixture transparent GEL type film (GEL-PAK® manufactured by DELPHON INDUSTRIES) and polydimethylsiloxane (PDMS), like a stamp to be detachably adhered through the van der Waals effect. As an example, PF-3-X4 of GEL-PAK® may be used as the organic silicone mixture transparent GEL type film. For example, the stamp 20 may include a GEL-PAK® layer 21 and a PDMS layer 25, and a surface of the PDMS layer 25 may be used as an attachment surface. A case in which the stamp 20 having a two-layer structure including the GEL-PAK® layer 21 and the PDMS layer 25 is applied is illustrated in the present embodiment but is only an example and an embodiment of the stamp 20 is not limited thereto. The stamp 20 may be variously configured by stamping a material like a stamp to be detachably adhered through the van der Waals effect.

Figure 10B:
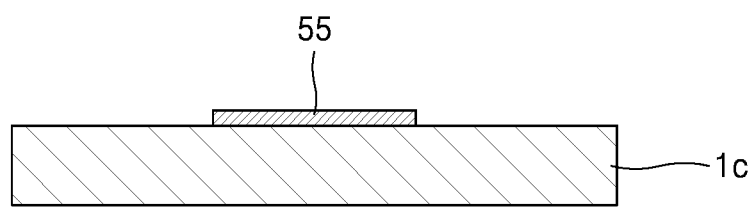
Figure 10C:
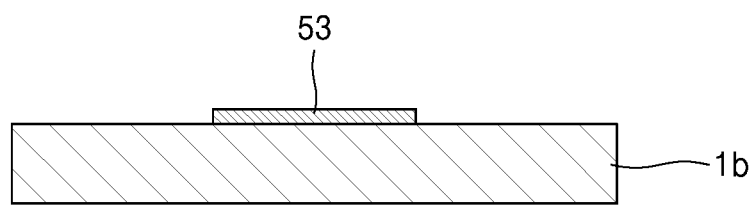
Figure 10D:
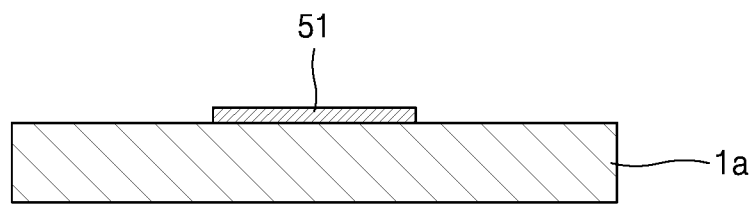
Figure 10E:
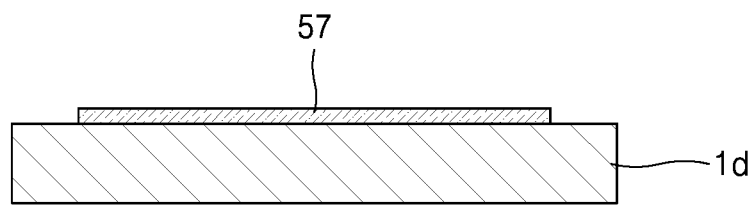
Figure 10F:
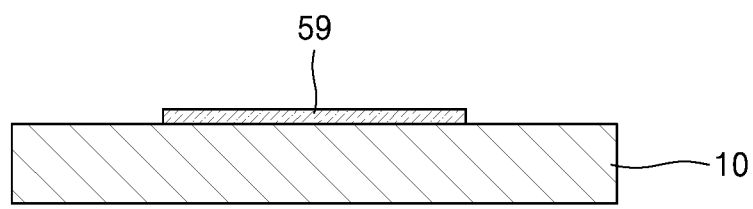

In order to form the planar structure 50 of the first 2D material layer 55, the graphene layer 53, and the second 2D material layer 51 in a state attached to the attachment surface of the stamp 20, first, first to third substrates 1c, 1b, and 1a on which the first 2D material layer 55, the graphene layer 53, and the second 2D material layer 51 are respectively formed may be prepared as illustrated in FIGS. 10B, 10C, and 10D. Also, as illustrated in FIG. 10E, a fourth substrate 1d having thereon a protective layer 57 to be used as an upper protective layer may be prepared. Also, as illustrated in FIG. 10F, a device substrate 10 having thereon a protective layer 59 to be used as a lower protective layer may be prepared.

Thus, after preparing for manufacturing the Josephson junction device, processes of FIGS. 11A to 11D may be sequentially performed to form the planar structure 50 of the first 2D material layer 55, the graphene layer 53, and the second 2D material layer 51 as illustrated in FIG. 2 in a state attached to the attachment surface of the stamp 20.

Figure 11A:
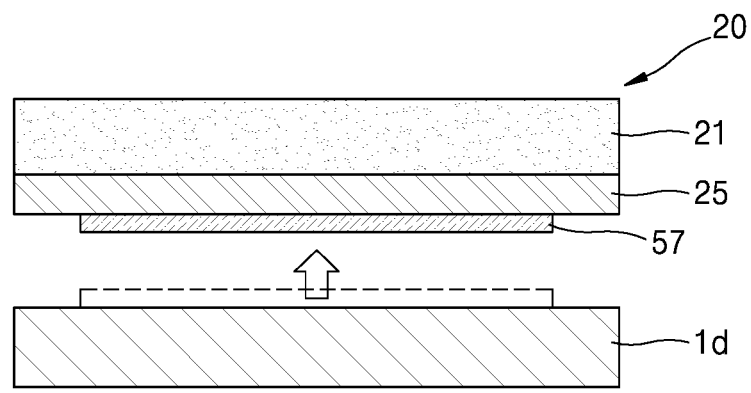
FIGS. 11A to 11D illustrate a process of forming a planar structure, which includes a first two-dimensional (2D) material layer, a graphene layer, and a second 2D material layer, to be attached onto an attachment surface of a stamp.

That is, referring to FIG. 11A, the protective layer 57, which is to be used as an upper protective layer, may be stamped to the stamp 20 from the fourth substrate 1d to be attached to the attachment surface of the stamp 20.

Figure 11B:
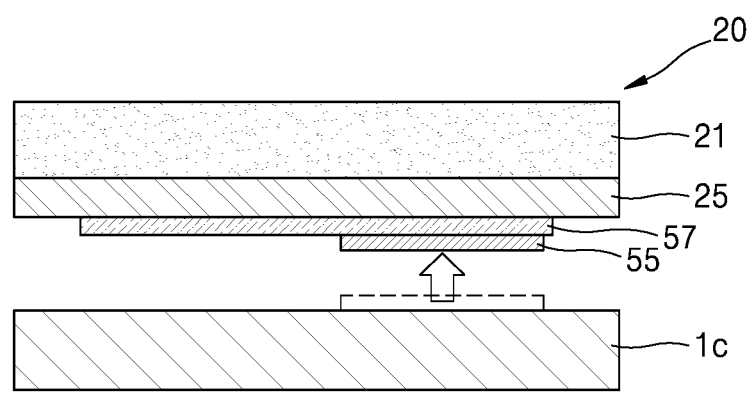

Next, as illustrated in FIG. 11B, the first 2D material layer 55 is stamped to the stamp 20 from the first substrate 1c to be attached to the attachment surface of the stamp 20.

Figure 11C:
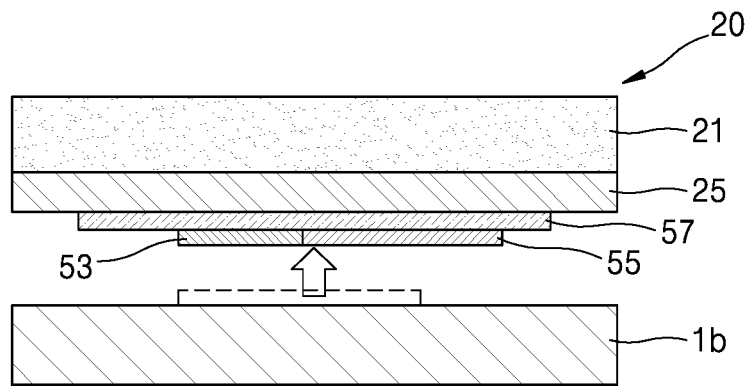

Next, as illustrated in FIG. 11C, the graphene layer 53 is stamped to the stamp 20 from the second substrate 1b to form a first junction with the first 2D material layer 55, so that the first 2D material layer 55 and the graphene layer 53 may be attached to the stamp 20 to be planarly arranged to each other.

Figure 11D:
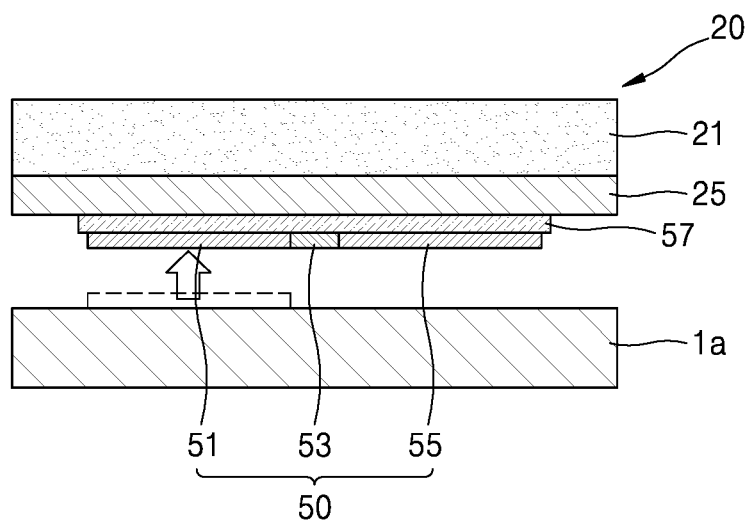

Next, as illustrated in FIG. 11D, the second 2D material layer 51 is stamped to the stamp 20 from the third substrate 1a to form a second junction with the graphene layer 53, so that a planar structure 50 including the first 2D material layer 55, the graphene layer 53, and the second 2D material layer 51 may be formed in a state attached to the stamp 20.

As described above, after the planar structure 50 on which the first 2D material layer 55, the graphene layer 53, and the second 2D material layer 51 are planarly arranged is formed in the state attached to the attachment surface of the stamp 20, the stamp 20 may be stamped onto the device substrate 10 having thereon the protective layer 59 to be used as a lower planar structure, so that the planar structure 50 including the first 2D material layer 55, the graphene layer 53, and the second 2D material layer 51 may be attached to the device substrate 10 as illustrated in FIG. 3.

Thereafter, as illustrated in FIG. 4, a peripheral portion of the planar structure 50 may be removed by an etching process, thereby forming a Josephson junction device including the first 2D material layer 55, the graphene layer 53 and the second 2D material layer 51 which are planarly arranged on the device substrate 10.

In the etching process, for example, an etching gas such as $CF_4/O_2$ plasma may be used, and the peripheral portion of the planar structure 50 may be removed by etching while leaving only a region to be used as a Josephson junction device, thereby manufacturing the Josephson junction device.

In a Josephson junction device and a manufacturing method thereof according to an embodiment, single-layer graphene is applied as the graphene layer 53, and thus, the stamp 20 in which the planar structure 50, which is formed by stamping the graphene layer 53 to form a first junction with the first 2D material layer 55 and stamping the second 2D material layer 51 to form a second junction with the graphene layer 53, is attached to the attachment surface may be stamped onto the device substrate 10 to form the planar structure 50 on the device substrate 10, thereby obtaining a Josephson junction device in which the first 2D material layer 55, the graphene layer 53, and the second 2D material layer 51 are planarly arranged.

Because the first junction between the first 2D material layer 55 and the graphene layer 53 and the second junction between the graphene layer 53 and the second 2D material layer 51 are achieved through stamping-contact, a contact between the 2D material used to form the first and second 2D material layers 55 and 51 and graphene used to form the graphene layer 53 is not chemically influenced, thereby preventing chemical damage to these materials.

Because the first 2D material layer 55, the graphene layer 53, and the second 2D material layer 51 are planarly arranged, the peripheral portion of the planar structure 50 may be removed by a simple etching process and thus a Josephson junction device may be easy to fabricate in a desired shape.

A process of attaching the protective layer 57, which is to be used as an upper protective layer, to the attachment surface of the stamp 20 may be performed prior to the attaching of the planar structure 50 to the attachment surface of the stamp 20, and a process of forming the protective layer 59, which is to be used as a lower protective layer, on the device substrate 10 may be performed prior to the attaching of the planar structure 50 to the device substrate 10 by stamping the stamp 20 onto the device substrate 10, so that the graphene layer 53 may be encapsulated with the protective layers 57 and 59 such as h-BN. Therefore, characteristics of 2D graphene may be maintained to facilitate exhibition of ballistic characteristics, and the Josephson junction device may be protected from being chemically and physically damaged. Therefore, the Josephson junction device may be manufactured not to be exposed to the outside, and the first junction between the first 2D material layer 55 and the graphene layer 53 and the second junction between the graphene layer 53 and the second 2D material layer 51 are achieved by stamping-contact, thereby forming a Josephson junction device having no chemical defects at the junctions.

In a Josephson junction device according to an embodiment, gate tuning which is a property of a graphene material may be implemented when twisted bi-layer graphene is applied to exhibit a superconducting property in at least one of the first and second 2D material layers 55 and 51.

Figure 5:
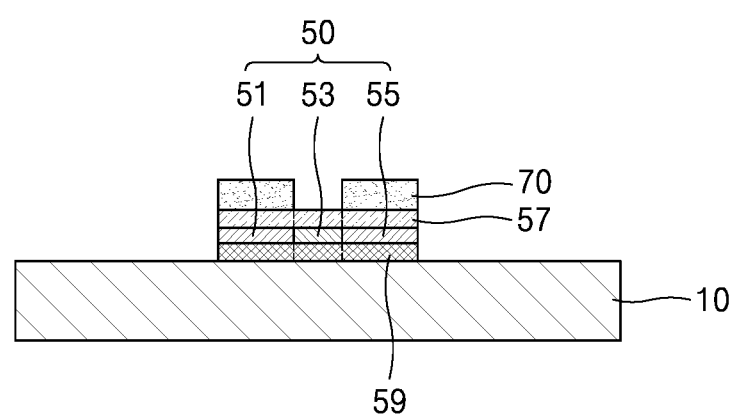
FIG. 5 schematically illustrates a Josephson junction device according to one or more examples of another embodiment.

Therefore, when twisted bilayer graphene is applied to exhibit a superconducting property in at least one of the first and second 2D material layers 55 and 51, the Josephson junction device according to the embodiment may further include a gate metal layer 70 to change electrical characteristics through a gate as illustrated in FIG. 5.

FIG. 5 illustrates an embodiment in which the gate metal layer 70 is provided on each of the first and second 2D material layers 55 and 51. When twisted bilayer graphene is applied to only one of the first and second 2D material layers 55 and 51, the gate metal layer 70 may be applied only on the first or second 2D material layer 55 or 51 to which the twisted bilayer graphene is applied.

In the embodiment of FIG. 5, the gate metal layer 70 is further provided in the Josephson junction device of FIG. 1. In FIG. 5, the gate metal layer 70 may correspond to an upper gate.

In order to manufacture the Josephson junction device of FIG. 5, the manufacturing process described above with reference to FIGS. 2 to 4, 10A to 10F and 11A to 11D may apply until the gate metal layer 70 is formed.

FIGS. 6 to 9 illustrate a process of manufacturing the Josephson junction device of FIG. 5 by further forming the gate metal layer 70 on the structure of FIG. 1.

Figure 6:
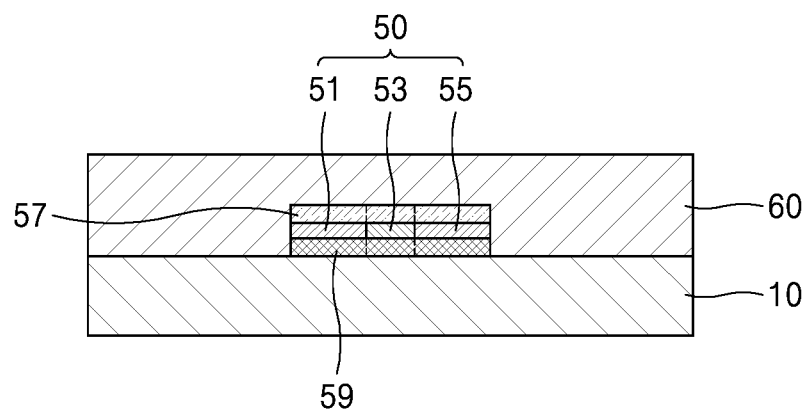
FIGS. 6 to 9 illustrate a process of manufacturing the Josephson junction device of FIG. 5 by further forming a gate metal layer on a structure of FIG. 1.

In order to form the gate metal layer 70, first, a mask layer 60 for a lithography process is formed on a Josephson junction element having the structure of FIG. 1 as illustrated in FIG. 6. The mask layer 60 may be, for example, a poly(methyl methacrylate) (PMMA) coating layer or may be coated or deposited with various materials capable of being patterned through the lithography process.

Figure 7:
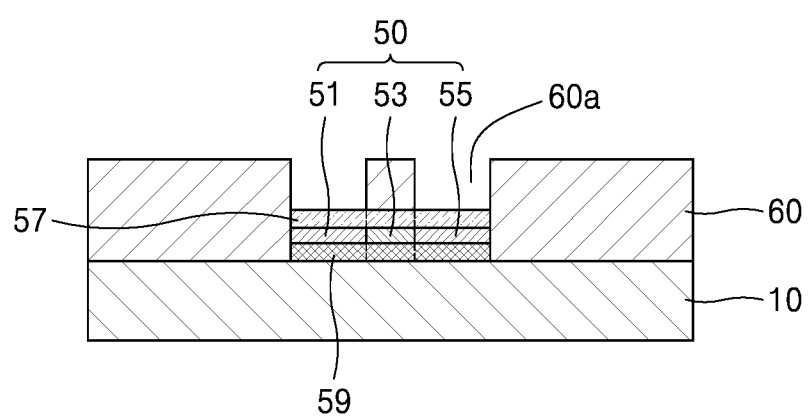

Next, as illustrated in FIG. 7, the lithography process is performed to pattern the mask layer 60 to form an opening 60a exposing the first and second 2D material layers 55 and 51.

Figure 8:
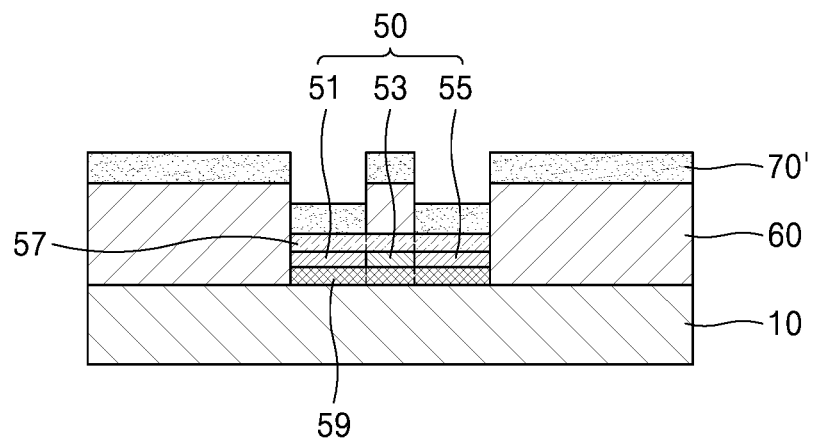
Figure 9:
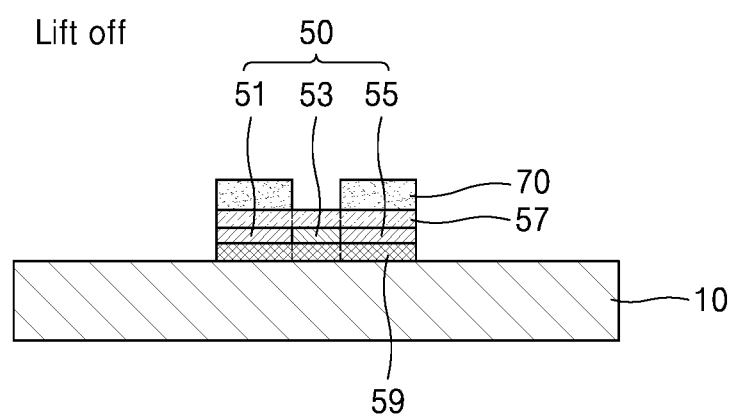

Next, a gate metal layer 70' may be formed to form an upper gate as illustrated in FIG. 8 and the mask layer 60 may be removed by a lift-off process as illustrated in FIG. 9, thereby obtaining a Josephson junction device in which the gate metal layer 70 is formed on the first and second 2D material layers 55 and 51.

A case in which the gate metal layer 70 corresponds to an upper gate is illustrated in the embodiment of FIG. 5 but a Josephson junction device according to an embodiment may have a structure including a lower gate. The Josephson junction device including a lower gate may be obtained by forming the protective layer 59 while a gate metal layer corresponding to a lower gate is formed on the substrate 10 and performing subsequent processes.

As described above, when in a Josephson junction device according to an embodiment, twisted bilayer graphene is applied to exhibit a superconducting property in the first and second 2D material layers 55 and 51 and the gate metal layer 70 is further provided to be electrically connected to the first and second 2D material layers 55 and 51, electrical characteristics may be changed by gate tuning to control the Josephson effect, thereby changing a threshold current value. Therefore, the Josephson junction device may be used as a qubit device.

A case in which protective layers are provided on upper and lower surfaces of the Josephson junction device by performing attaching the protective layer 57, which is to be used as an upper protective layer, to the attachment surface of the stamp 20 prior to forming the planar structure 50 in a state attached to the attachment surface of the stamp 20 and forming the protective layer 59, which is to be used as a lower protective layer, on the device substrate 10 prior to attaching the planar structure 50 to the device substrate 10 by stamping the stamp 20 to the device substrate 10 has been described above as an example. However, as described above, a protective layer may be provided on only one of the upper and lower surfaces of the Josephson junction device. In this case, the forming of the protective layer 57, which is to be used as an upper protective layer, on the fourth substrate 1d and the attaching of the protective layer 57 to the attachment surface of the stamp 20 as illustrated in FIGS. 10E and 11A or the forming of the protective layer 59, which is to be used as a lower protective layer, on the device substrate 10 as illustrated in FIG. 10F may be skipped. When a protective layer is not provided on both the upper and lower surfaces of the Josephson junction device, all the processes of FIGS. 10E, 11A and FIG. 10F may be skipped.

A Josephson junction device according to an embodiment has a structure in which the first 2D material layer 55 used as a superconducting electrode, the graphene layer 53, and the second 2D material layer 51 used as a superconducting electrode are planarly arranged and thus it is possible to prevent an error from occurring in a portion where the Josephson effect is formed.

In a Josephson junction device and a manufacturing method thereof according to an embodiment, a first 2D material layer used as a superconducting electrode, a graphene layer, and a second 2D material layer used as a superconducting electrode are planarly arranged, and a junction between the first 2D material layer and the graphene layer and a junction between the graphene layer and the second 2D material layer are formed by stamping-contact in the planar arrangement. Therefore, a Josephson junction device having no chemical defects at the junctions may be achieved, and it is possible to prevent an error from occurring in a portion where the Josephson effect is formed.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A Josephson junction device comprising a planar arrangement comprising a first two-dimensional (2D) material layer, a graphene layer, and a second 2D material layer planarly arranged on a device substrate, the first 2D material layer comprising at least one layer of a 2D material, the graphene layer forming a first junction with the first 2D material layer, and the second 2D material layer forming a second junction with the graphene layer and comprising at least one layer of a 2D material,
    wherein the graphene layer is disposed between the first 2D material layer and the second 2D material layer, and
    wherein a distance between the first junction and the second junction is within a range configured to cause a Josephson effect.

2. The Josephson junction device of claim 1, wherein the first 2D material layer and the second 2D material layer each comprise a material which generates a superconducting proximity effect at the first and second junctions, respectively, to form superconducting electrodes.

3. The Josephson junction device of claim 2, wherein at least one of the first and second 2D material layers comprises at least one layer of $NbSe_2$, FeSe, $PdTe_2$, CuFeTe, FeTe, $NbS_2$ (2H-phase), $TaSe_2$ (2H-phase), $TaS_2$ (2H-phase), $Bi_2Sr_2CaCu_2O_{8+\delta}$ (Bi2212), and twisted bilayer graphene to exhibit a superconducting property.

4. The Josephson junction device of claim 3, wherein the graphene layer comprises single-layer graphene.

5. The Josephson junction device of claim 1, wherein the graphene layer comprises single-layer graphene.

6. The Josephson junction device of claim 1, wherein at least one of the first and second 2D material layers comprises at least one layer of $NbSe_2$, FeSe, $PdTe_2$, CuFeTe, FeTe, $NbS_2$ (2H-phase), $TaSe_2$ (2H-phase), $TaS_2$ (2H-phase), $Bi_2Sr_2CaCu_2O_{8+\delta}$ (Bi2212), and twisted bilayer graphene to exhibit a superconducting property.

7. The Josephson junction device of claim 1, wherein a distance between the first junction and the second junction is about 100 nm to about 500 nm.

8. The Josephson junction device of claim 1, further comprising a protective layer on at least one of upper and lower surfaces of the planar arrangement comprising the first 2D material layer, the graphene layer, and the second 2D material layer.

9. The Josephson junction device of claim 8, wherein the protective layer comprises hexagonal-boron nitride (h-BN).

10. The Josephson junction device of claim 1, further comprising a gate metal layer, for gate tuning, on at least one of the first and second 2D material layers,
    wherein at least one of the first and second 2D material layers comprises twisted bilayer graphene to exhibit a superconducting property.

11. A method of manufacturing a Josephson junction device, the method comprising:
    forming a planar arrangement of a first two-dimensional (2D) material layer, a graphene layer, and a second 2D material layer in a state attached to an attachment surface of a stamp, the first 2D material layer comprising at least one layer of a 2D material, the graphene layer forming a first junction with the first 2D material layer, and the second 2D material layer forming a second junction with the graphene layer and comprising at least one layer of a 2D material, wherein a distance between the first and second junctions is within a range configured to cause a Josephson effect;
    attaching the planar arrangement comprising the first 2D material layer, the graphene layer, and the second 2D material layer to a device substrate by stamping the stamp onto the device substrate; and
    forming the Josephson junction device comprising the first 2D material layer, the graphene layer, and the second 2D material layer, which are planarly arranged on the device substrate, by removing a peripheral portion of the planar arrangement by an etching process.

12. The method of claim 11, wherein the forming of the planar arrangement in the state attached to the attachment surface of the stamp comprises:
    preparing a first substrate, a second substrate, and a third substrate on which the first 2D material layer, the graphene layer, and the second 2D material layer are respectively formed;
    stamping the first 2D material layer to the stamp from the first substrate to attach the first 2D material layer to the attachment surface of the stamp;
    stamping the graphene layer to the stamp from the second substrate so as to form a first junction with the first 2D material layer such that the first 2D material layer and the graphene layer are planarly attached to the stamp; and
    stamping the second 2D material layer to the stamp from the third substrate so as to form a second junction with the graphene layer such that the planar arrangement comprising the first 2D material layer, the graphene layer, and the second 2D material layer is attached to the stamp.

13. The method of claim 11, wherein the first 2D material layer and the second 2D material layer each comprise a material which generates a superconducting proximity effect at the first and second junctions, respectively, to form superconducting electrodes.

14. The method of claim 13, wherein at least one of the first and second 2D material layers comprises at least one layer of $NbSe_2$, FeSe, $PdTe_2$, CuFeTe, FeTe, $NbS_2$ (2H-phase), $TaSe_2$ (2H-phase), $TaS_2$ (2H-phase), $Bi_2Sr_2CaCu_2O_{8+\delta}$ (Bi2212), and twisted bilayer graphene to exhibit a superconducting property.

15. The method of claim 14, wherein the graphene layer comprises single-layer graphene.

16. The method of claim 11, wherein the graphene layer comprises single-layer graphene.

17. The method of claim 11, wherein a distance between the first junction and the second junction is about 100 nm to about 500 nm.

18. The method of claim 11, further comprising:
at least one of attaching a first protective layer to the attachment surface of the stamp before the forming of the planar arrangement to be attached to the attachment surface of the stamp, and forming a second protective layer on the device substrate before the attaching of the planar arrangement to the device substrate by stamping the stamp to the device substrate,
whereby a protective layer is disposed on at least one of upper and lower surfaces of the planar arrangement.

19. The method of claim 18, wherein the protective layer comprises hexagonal-boron nitride (h-BN).

20. The method of claim 11, further comprising forming a gate metal layer, for gate tuning, on at least one of the first and second 2D material layers,
wherein at least one of the first and second 2D material layers comprises twisted bilayer graphene to exhibit a superconducting property.

* * * * *